US008685853B2

(12) United States Patent
Tseng et al.

(10) Patent No.: US 8,685,853 B2
(45) Date of Patent: Apr. 1, 2014

(54) DUAL DAMASCENE COPPER PROCESS USING A SELECTED MASK

(75) Inventors: Fan Chung Tseng, Shanghai (CN); Chi Hsi Wu, Shanghai (CN); Wei Ting Chien, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/093,809

(22) Filed: Apr. 25, 2011

(65) Prior Publication Data

US 2012/0108054 A1 May 3, 2012

Related U.S. Application Data

(62) Division of application No. 11/539,614, filed on Oct. 6, 2006, now Pat. No. 7,989,341.

(30) Foreign Application Priority Data

Jan. 13, 2006 (CN) .......................... 2006 1 0023301

(51) Int. Cl.
*H01L 21/4763* (2006.01)
(52) U.S. Cl.
USPC ........... 438/637; 438/638; 438/643; 438/645; 438/700
(58) Field of Classification Search
USPC ......... 438/622, 624, 627, 633, 637, 638, 643, 438/645, 653, 700, 708
See application file for complete search history.

(56) References Cited

U.S. PATENT DOCUMENTS

| | | |
|---|---|---|
| 5,936,707 A | 8/1999 | Nguyen et al. |
| 6,225,221 B1 | 5/2001 | Ho et al. |
| 6,355,399 B1 | 3/2002 | Sajan et al. |
| 6,610,594 B2 | 8/2003 | Apelgren et al. |
| 6,825,562 B2 | 11/2004 | Naik et al. |
| 6,962,771 B1 | 11/2005 | Liu et al. |
| 7,235,474 B1 | 6/2007 | Dakshina-Murthy et al. |
| 7,364,836 B2 | 4/2008 | Liu et al. |
| 7,767,364 B2 * | 8/2010 | Ogawa et al. ................. 430/5 |

(Continued)

OTHER PUBLICATIONS

Final Office Action for U.S. Appl. No. 11/539,614 mailed on, Sep. 2, 2010, 14 pages.

(Continued)

*Primary Examiner* — Hsien Ming Lee
(74) *Attorney, Agent, or Firm* — Kilpatrick Townsend & Stockton LLP

(57) ABSTRACT

A method for creating a dual damascene structure while using only one lithography and masking step. Conventional dual damascene structures utilize two lithography steps: one to mask and expose the via, and a second step to mask and expose the trench interconnection. The novel method for creating a dual damascene structure allows for a smaller number of processing steps, thus reducing the processing time needed to complete the dual damascene structure. In addition, a lower number of masks may be needed. The exemplary mask or reticle used within the process incorporates different regions possessing different transmission rates. During the exposing step, light from an exposing source passes through the mask to expose a portion of the photoresist layer on top of the wafer. Depending on the transmission rate of the different regions, different thickness of the photoresist layer are exposed and later removed by a developing solution, which allows a subsequent etch process to remove portions of both the dielectric layer and photoresist layer to create a dual damascene structure.

7 Claims, 12 Drawing Sheets

(56) References Cited

U.S. PATENT DOCUMENTS

| | | | |
|---|---|---|---|
| 7,989,341 B2 | 8/2011 | Tseng et al. | |
| 2002/0182518 A1* | 12/2002 | Van Haren | 430/5 |
| 2003/0137055 A1 | 7/2003 | Trivedi | |
| 2003/0152873 A1* | 8/2003 | Tainaka et al. | 430/313 |
| 2004/0129573 A1 | 7/2004 | Cohen | |
| 2004/0241557 A1* | 12/2004 | Bellman et al. | 430/5 |
| 2005/0089763 A1* | 4/2005 | Tan et al. | 430/5 |
| 2006/0141773 A1 | 6/2006 | Kim | |
| 2006/0197228 A1 | 9/2006 | Daubenspeck et al. | |

OTHER PUBLICATIONS

Final Office Action for U.S. Appl. No. 11/539,614 mailed on, Mar. 18, 2009, 13 pages.
Non-Final Office Action for U.S. Appl. No. 11/539,614, mailed on, Dec. 14, 2010,15 pages.
Non-Final Office Action for U.S. Appl. No. 11/539,614, mailed on, Apr. 6, 2010, 15 pages.
Non-Final Office Action for U.S. Appl. No. 11/539,614, mailed on, Jul. 13, 2009, 15 pages.
Non-Final Office Action for U.S. Appl. No. 11/539,614, mailed on, Jun. 23, 2008,12 pages.
Notice of Allowance for U.S. Appl. No. 11/539,614, mailed on, May 9, 2011, 5 pages.
Notice of Allowance for U.S. Appl. No. 11/539,614, mailed on, Dec. 30, 2009, 7 pages.
Office Action for Chinese Patent Application No. 2006100233011; dated Mar. 28, 2008; 9 pages total (English translation not included).
Requirement for Restriction/Election for U.S. Appl. No. 11/539,614, mailed on Mar. 25, 2008, 7 pages.

* cited by examiner

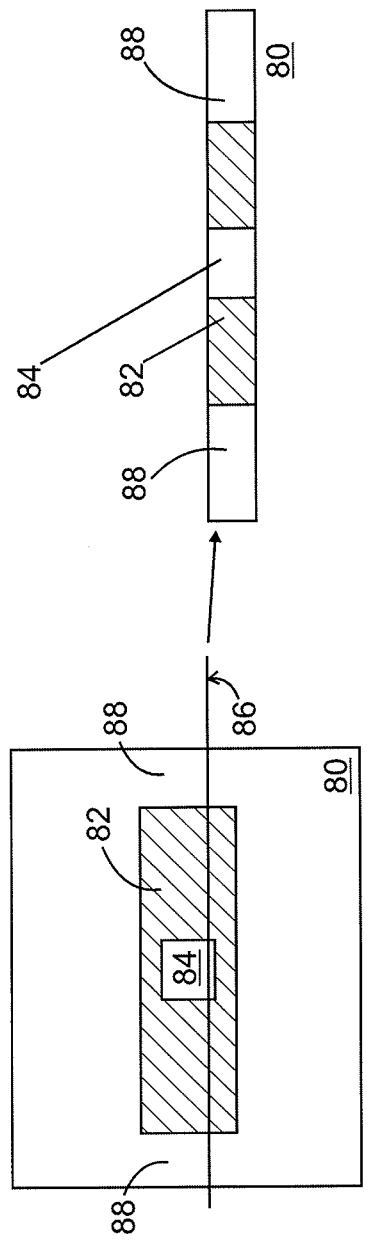

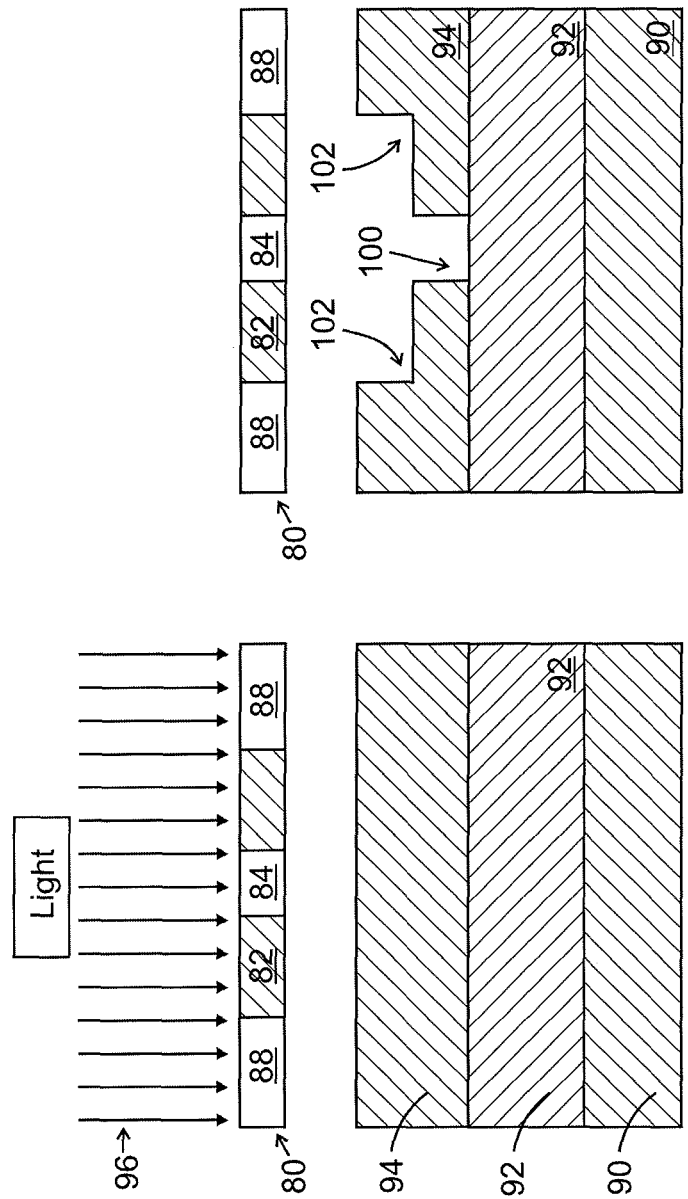

DUAL DAMASCENE COPPER PROCESS USING A SELECTED MASK

CROSS-REFERENCES TO RELATED APPLICATIONS

This present application is a divisional of and claims priority to U.S. application Ser. No. 11,539,614, entitled "Dual Damascene Copper Process Using a Selected Mask," filed Oct. 6, 2006, and Chinese Patent Application No. 200610023301.1, filed Jan. 13, 2006, commonly assigned, and incorporated herein by reference in its entirety.

BACKGROUND OF THE INVENTION

The present invention is directed to integrated circuits and their processing for the manufacture of semiconductor devices. More particularly, the invention provides a novel method for a dual damascene process that uses a selected mask in the manufacture of integrated circuits. Merely by way of example, the invention can applied to a copper metal damascene structure such as a dual damascene structure used for advanced signal processing devices. But it would be recognized that the invention has a much broader range of applicability. For example, the invention can be applied to microprocessor devices, logic circuits, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form interchanging metal and dielectric layers, where the metal layers are not meant to interact with other metal layers in the form of noise.

As merely an example, aluminum metal layers have been the choice of material for semiconductor devices as such layers have been used in early integrated circuit devices. Aluminum provides good conductivity and adheres to dielectric materials as well as semiconductor materials. Most recently, however, aluminum metal layers have been replaced in part by copper interconnects. Copper interconnects have been used with low-k dielectric materials to form advanced conventional semiconductor devices. Copper possesses reduced resistance values compared to aluminum for propagating signals through the copper interconnect at high speeds. However, one significant problem that has occurred with the increasing use of copper interconnects is that copper is a much more difficult material than aluminum to etch and pattern because it does not form a volatile byproduct. Thus, copper metallization schemes cannot be used with conventional subtractive etching procedures used for aluminum. Dual damascene processes have been used instead of conventional metallization schemes whereby the interconnect trench and via are formed within the same sequence of process steps and a chemical-mechanical planarization step (CMP) is used to remove the overfill of deposited material in the trench and via. While dual damascene processes have reduced the number of steps used in the process sequence, even greater simplification could be implemented to reduce complexity of the dual-damascene process being employed.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a novel method for a dual damascene process that uses a selected mask in the manufacture of integrated circuits. Merely by way of example, the invention can be applied to a copper metal damascene structure such as a dual damascene structure used for advanced signal processing devices. But it would be recognized that the invention has a much broader range of applicability. For example, the invention can be applied to microprocessor devices, logic circuits, application specific integrated circuit devices, as well as various other interconnect structures.

In a specific embodiment, the invention provides a method of manufacturing integrated circuit devices. A semiconductor substrate is provided with a surface region that has at least a copper layer, dielectric layer, and photoresist layer overlying the surface region. A mask is placed over the semiconductor substrate wherein the mask has a plurality of regions with different transmission rates, with a first region of the mask possessing a first transmission rate and a second region of the mask possessing a second transmission rate lower than the first transmission rate. The photoresist layer is then exposed to an exposing source through the mask wherein a first thickness of a first portion of the photoresist layer below the first region of the mask is exposed and a second thickness of a second portion of the photoresist layer below the second region of the mask is exposed. The photoresist layer is then subjected to a developing agent whereby the first thickness of the first portion and the second thickness of the second portion of the photoresist layer are removed, and the photoresist layer and dielectric layer are etched to create a via opening in the dielectric layer where the first thickness of the first portion of the photoresist layer was removed and a trench opening in the dielectric layer where the second thickness of the second portion of the photoresist layer was removed, whereby the via opening contacts the copper layer.

In a specific embodiment of the invention, a method of manufacturing integrated circuit devices is described. A semiconductor substrate is provided with a surface region that has at least a copper layer, dielectric layer, and photoresist layer overlying the surface region. A portion of the photoresist layer is exposed by placing a reticle over the photoresist layer and transmitting light from an exposing source to the photoresist layer, the reticle possessing at least two regions with different transmission rates, a first region of the reticle being used to create a via etch pattern in the photoresist layer and a second region of the reticle being used to create a trench etch pattern in the photoresist layer. The photoresist layer is then developed, whereby a first portion of the photoresist layer is removed to expose a portion of the dielectric layer and a thickness of the second portion of the photoresist layer is formed The photoresist layer and the dielectric layer are etched in a single step to create a dual damascene pattern in the dielectric layer.

In a specific embodiment of the invention, a reticle for use in a lithography process used to create a dual damascene structure on a substrate is described. The reticle comprises a light-transmissive substrate placed over a wafer in an exposing process, a first region of the reticle located on the light-transmissive substrate which possesses a first transmission rate, the first region of the reticle used to create a via pattern for the dual damascene structure, and a second region of the reticle located on the light-transmissive substrate which possesses a second transmission rate lesser than the first, the second region of the reticle used to create a trench pattern for the dual damascene structure.

Many benefits are achieved by way of the present invention over conventional techniques. For example, the present technique provides an easy to use process that relies upon conventional technology. In some embodiments, exemplary methods used reduce the number of required process steps by only utilizing one lithography step instead of two steps as required by a conventional dual damascene processes. Additionally, only a selected lithography mask is required as opposed to the two or more masks required in conventional dual damascene processes. In some embodiments, a reduced process time can be achieved by using fewer process steps, leading to cost savings and a reduced cycle time. Additionally, the method provides a process that is compatible with conventional process technology without substantial modifications to conventional equipment and processes. Depending upon the specific embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 3A is a simplified top view of an exemplary mask used in a photolithography process;

FIG. 3B is a simplified cross-section view of an exemplary mask used in a photolithography process;

FIGS. 4A-4E are simplified exemplary cross-section views of layers overlying a surface region during a dual damascene process using a selected mask.

DETAILED DESCRIPTION OF THE INVENTION

The present invention is directed to integrated circuits and their processing for the manufacture of semiconductor devices. More particularly, the invention provides a novel method for a dual damascene process that uses a selected mask in the manufacture of integrated circuits. Merely by way of example, the invention can be applied to a copper metal damascene structure such as a dual damascene structure used for advanced signal processing devices. But it would be recognized that the invention has a much broader range of applicability. For example, the invention can be applied to microprocessor devices, logic circuits, application specific integrated circuit devices, as well as various other interconnect structures.

Figure 1A:
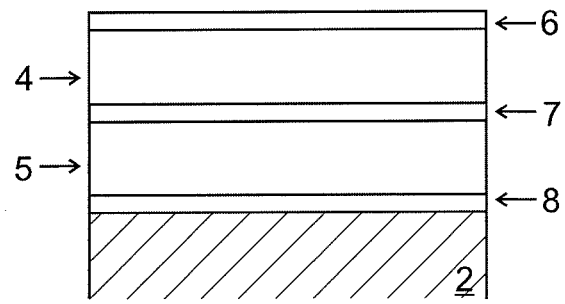
FIGS. 1A-1H are simplified cross-section views of layers overlying a surface region during a trench-first dual damascene process.
Figure 1B:
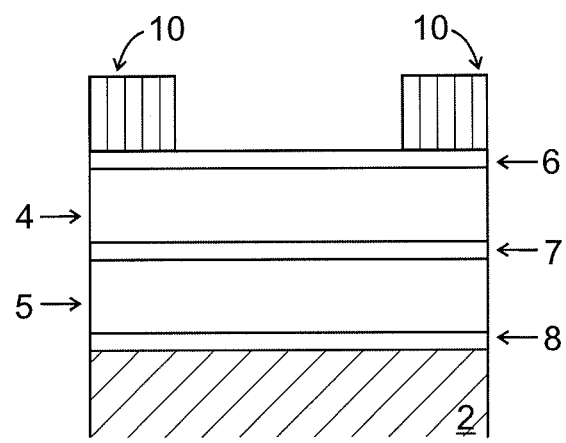
Figure 1C:
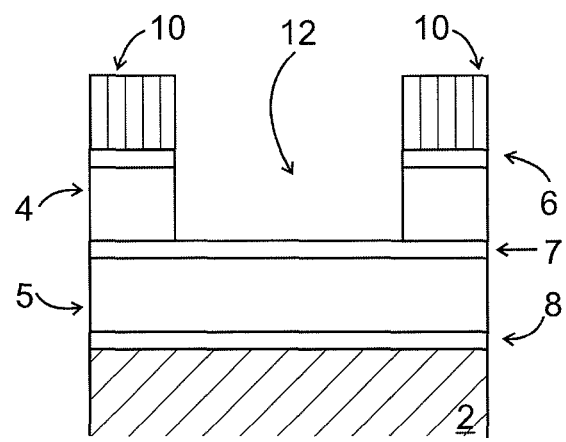

FIGS. 1A-1H are simplified cross-section views of layers overlying a surface region during a trench-first dual damascene process; In FIG. 1A, three layers of hard mask 6, 7, 8 and two layers of low-k dielectric 4, 5 overly copper line 2. Copper line 2 additionally overlies a surface region (not shown) formed on a semiconductor substrate (not shown). The surface region may comprise any number of layers overlying the semiconductor substrate and is not limited to consist of only one layer. The hard mask layers may comprise a silicon nitride material, but may also comprise other etch stop layers such as silicon carbide or silicon carbon nitride. The low-k dielectric used may be one of the following dielectrics, but is not limited to, Aurora 2.85, Black Diamond, Coral, or SiLK. A layer of photoresist is deposited over the topmost hard mask layer 6 and lithographically patterned to expose a trench opening by using a first lithography mask (not shown). FIG. 1B shows the result of the deposition step, where portions of the photoresist 10 remain on the topmost layer of hard mask 6. An etch process, preferably an anisotropic dry etch, is used to etch trench 12 through hard mask layer 6 and dielectric layer 4, stopping at embedded second hard mask layer 7. Photoresist layers 10 protect portions of hard mask layer 6 and dielectric layer 4 which adjoin trench 12. The result of the etch process is shown in FIG. 1C.

Figure 1D:
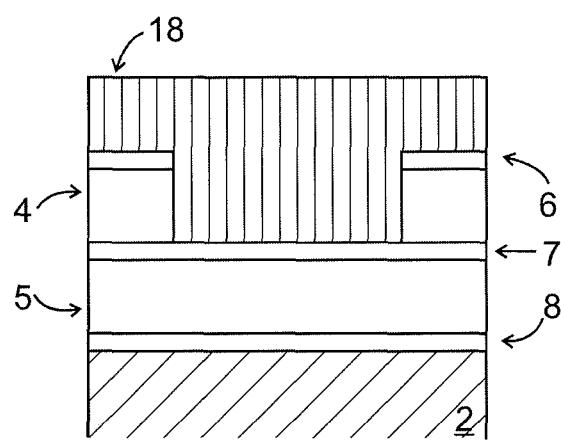
Figure 1E:
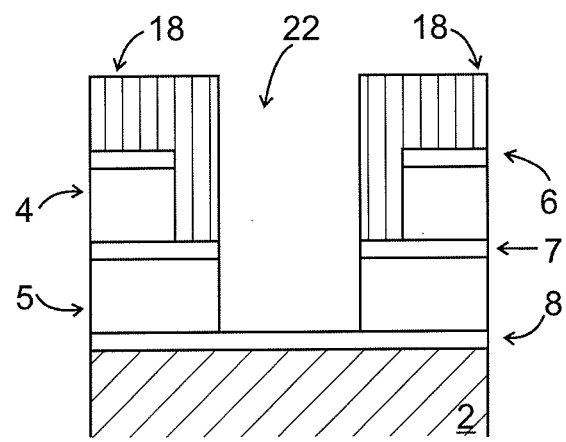

Following the etch process, a photoresist strip is performed to remove photoresist portions 10 from the structure in FIG. 1C. Surface mask layers 6, 7 function to protect dielectric layers 4 and 5 from the chemicals used in the photoresist stripping process. In FIG. 1D, photoresist layer 18 is deposited, which fills trench 12 and also is present above regions of topmost hard mask layer 6 adjoining trench 12. Photoresist layer 18 is lithographically patterned using a second mask layer to expose an opening for via 22. Via 22 is etched through embedded stop layer 7 and dielectric layer 5 to bottom hard mask layer 8. The result of the via etch is shown in FIG. 1E. Via 22 has a width smaller than that of trench 12 formed in the trench etch step. Bottom hard mask layer 8 remains intact during the etching process as copper ions can be sputtered from copper line 2 up into via 22 if bottom hard mask layer 8 is etched through. The copper ions can diffuse into exposed regions of dielectric layers 4 and 5, which can lead to poor device performance and electrical failure.

Figure 1F:
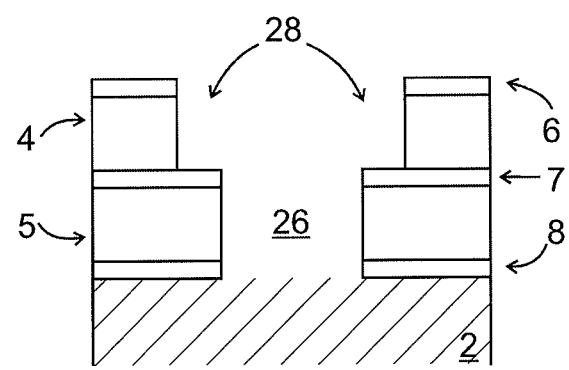

Due to the difficulty in tailoring the process parameters of the via etch process to etch through photoresist layer 18, dielectric layer 5, and hard mask layer 7 but not hard mask layer 8 at the bottom of trench 22, an additional etch process is employed instead of relying solely on one etch process. An additional controlled etch process is used to remove the portion of bottom hard mask layer 8 exposed by the via etch process. The etch process used to remove the portion of bottom hard mask layer 22 is selected to remove only the hard mask layer and not etch into copper line 2 below. Following the controlled etch process, a photoresist strip process can be used to remove photoresist layer 18. The result of these steps is shown in FIG. 1F, where a trench 28 and via 26 have been formed.

Figure 1G:
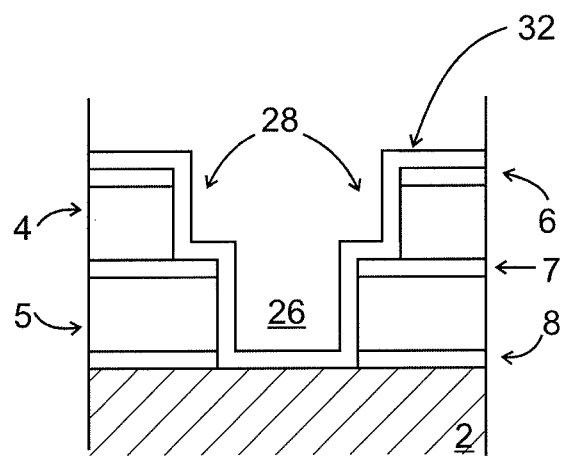

A thin diffusion barrier layer 32 is then deposited lining the dual damascene structure shown in FIG. 1G, thus preventing the copper deposited in the following step from diffusing into dielectric layers 4 and 5. The barrier layer material may comprise, but is not limited to, titanium nitride (TiN), tantalum nitride (TaN) or tantalum (Ta). A copper seed layer can then deposited over the barrier layer, and an electrochemical plating process can be used to plate copper ions onto the seed layer, thus filling both the trench and via with copper 36. A CMP process can be used to remove the overfill portion of copper layer 36 and leave copper layer 36 at the correct height. Of course, there can be other variations, modifications, and alternatives.

While a trench-first process has been described in regards to FIGS. 1A-1H, a via-first approach could also be used Instead of trench 12 being etched first in the dual damascene process, via 22 can be etched first to the bottom etch stop layer and a trench subsequently etched. One of the disadvantages of a via-first dual damascene process is that the photoresist applied to mask the via etch within the trench-first process will pool in the area where the via is formed, making it extremely difficult to form the vias at lower device geometries.

Figure 1H:
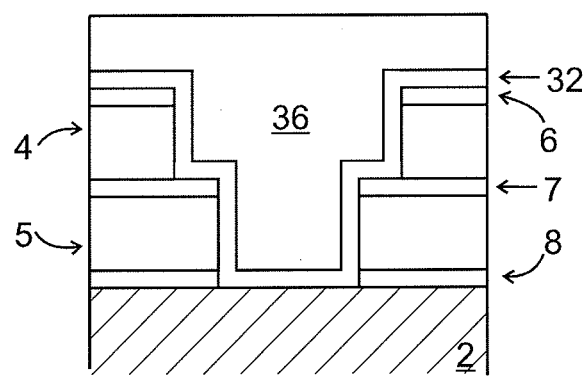

The trench-first dual damascene process used in FIGS. 1A-1H utilizes two photolithography and masking steps to create the copper-filled dual damascene structure shown in FIG. 1H, first to mask photoresist layer 10 to expose a contact opening for the trench etch and second, to mask photoresist layer 18 to expose a contact opening for the via etch. A via-first dual damascene process also utilizes two photolithography and masking steps, first for the via etch process extending down to the bottom hard mask layer and second, for the trench etch process which etches a trench into to middle hard mask layer. There is significant incentive to reduce the number of process steps used in the dual damascene process, if at all possible. Additional process steps take additional processing time, allowing for a fewer number of wafers to be processing in the same amount of time which reduces throughput. Additionally, a greater number of process steps makes the likelihood of an error occurring during the processing of the wafers more likely, leading to a greater possibility of a failure destroying or otherwise rendering the wafers unusable. Even slight imperfections or tight tolerances in processing steps can result in chips that are nonfunctional or not made to specifications. Additional process steps can also lead to greater cycle times, thus increasing the manufacturing time for the chips to be completed and leading to a longer time to market. Of course, there can be other variations, modifications, and alternatives.

Asides from the cost of additional processing steps in terms of greater cycle time and a larger amount of error, one other concern is the cost of the equipment used within the additional process steps. A typical mask-writing tool for photolithography and masking processes used in a to create mask templates that is used to create the chip designs on a wafer can cost between 15-20 million dollars for the tool itself, not including operational and repair costs. Furthermore, a mask set can cost in the millions of dollars, with the cost for masks increasing for smaller process nodes. For this reason, it would be extremely advantageous to develop a dual damascene process that utilized only one lithography and masking step and consequently only a selected mask to create a dual damascene structure.

The masks described within this application can also be described as photoreticles or reticles, depending upon the specific implementation used. For example, a reticle can be used for the mass production of integrated circuit devices, when a stepper or scanner is used to recreate the pattern on the reticle upon multiple regions of a single wafer.

Figure 2A:
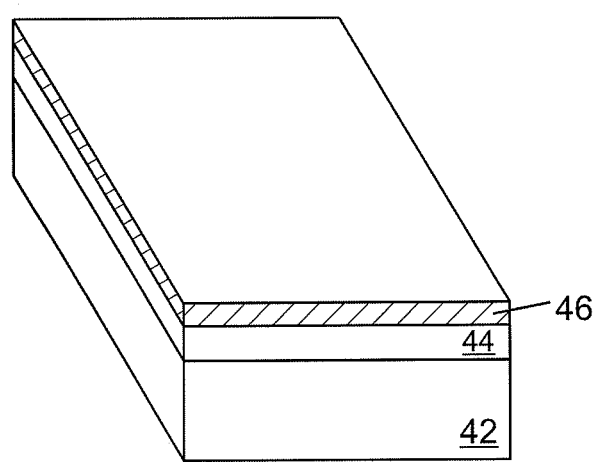
FIGS. 2A-2F are simplified exemplary diagrams showing implementation of a photolithography process on a portion of a wafer using either positive or negative resists.

To understand how an exemplary embodiment of the invention showing a dual damascene process employing only a selected mask could be employed, it is first necessary to understand the lithography process by which patterns can be written on the surface of a semiconductor material. FIGS. 2A-2F are simplified exemplary diagrams showing implementation of a photolithography process on a portion of a wafer using either positive or negative resists. These diagrams are merely examples, which should not unduly limit the scope of the claims herein. One of ordinary skill in the art would recognize many variations, modifications, and alternatives. FIG. 2A shows an exemplary portion of a semiconductor substrate with a photoresist layer 46 and silicon dioxide ($SiO_2$) layer 44 overlying a silicon substrate 42. A surface region comprising one or more layers could also be included between the silicon dioxide layer 44 and the silicon substrate 42. The photoresist layer may be either a negative or positive photoresist, depending upon the specific requirements of the circuit being manufactured and the materials available. Photoresist layer 46 is commonly applied to the wafer using a spin coating procedure whereby the spinning process causes the aqueous photoresist to distribute over the entire surface of the wafer. A primer may also be applied to ensure adhesion to the layer directly below the photoresist, in this case silicon dioxide layer 44. A soft bake process is then used to harden the resist to a level where it can be exposed and developed in subsequent steps. Of course, there can be other variations, modifications, and alternatives.

Figure 2B:
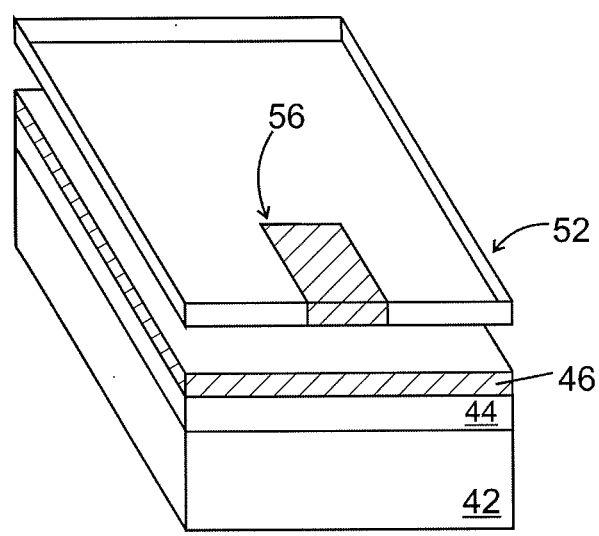

FIG. 2B shows mask 52 imposed over photoresist layer 46. This step occurs during a mask alignment and exposure step whereby the mask is correctly aligned with alignment features on the wafer to transfer the pattern from the mask to the photoresist layer 46. In a specific embodiment of the invention, the alignment feature used may be an alignment mark or notch, or other feature that helps to correctly orient the wafer to the alignment equipment. Mask 52 is typically formed from a fully light-transparent material such as quartz or soda lime glass, and may be etched or patterned. Mask 52 further includes a blocking region 56 which prevents light from passing through and reacting with photoresist layer 46 in a later exposing step. Incorrect alignment of the mask can cause misalignment of features of the device being formed on the substrate, leading to electrical problems and faulty circuits. Blocking region 56 may be formed by chemically treating mask 52 to form regions with different light transmission properties, or may be formed by adhering additional layers possessing different light transmission characteristics to mask 52. For example, blocking region 56 may be formed from an non-transmissive or partially transmissive opaque material such as chrome or iron oxide ($Fe_2O_3$). The method by which blocking region 56 is formed is not critical to the process, so long as blocking region 56 can block a degree of light from passing through mask 52 to react with photoresist layer 46. Blocking region 56 is typically formed on the bottom of mask 52, but may also be formed on top of mask 52 depending on the application. Mask 52 may also be etched or otherwise patterned to create patterns upon the wafer. Of course, there can be other variations, modifications, and alternatives.

After mask 52 has been properly aligned with the wafer, a lens system shines visible or ultraviolet light through the mask onto the wafer. In the transparent regions of the mask, light passes through the mask and exposes the corresponding regions of the photoresist directly underneath, while blocking region 56 prevents light from passing though, leaving the regions of photoresist layer 52 directly beneath blocking region 56 unexposed. The exposure may be performed by a stepper machine which projects the same pattern onto the wafer onto the wafer, or may be performed by proximity or projection systems where the mask is the same size as the wafer pattern, meaning the reproduction ratio is 1:1. Of course, there can be other variations, modifications, and alternatives.

Figure 2C:
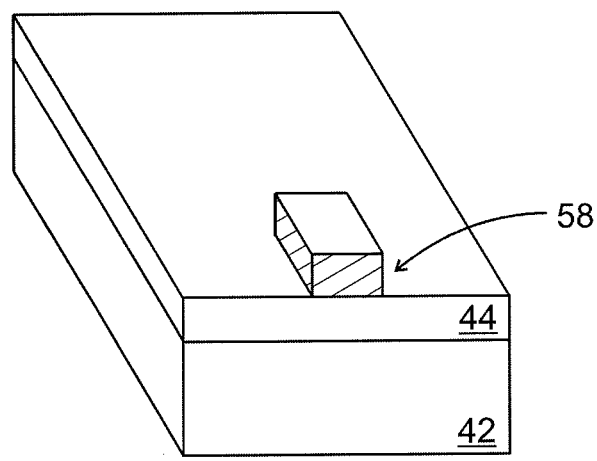

During the exposure process, the photoresist exposed to light undergoes a chemical reaction. The specific reaction varies depending on whether a positive or negative photoresist is used. When a positive photoresist is exposed to light, it decomposes when exposed to a developing agent, allowing the underlying layer to be appropriately patterned by a subsequent process. FIG. 2C illustrates an exemplary portion of a semiconductor substrate after exposure of the positive photoresist to light and subsequent wet chemical development where the chemical developer only dissolves the photoresist in the exposed areas. As blocking region 56 prevents transmission of light to the portion of photoresist 46 directly below the region, the remainder of photoresist 46 is exposed to light and subsequently removed by the developing agent. A postbake or hard bake process may be used to stabilize and harden the developed photoresist. This leaves resist block 58 remaining on top of $SiO_2$ layer 44 as shown in FIG. 2C. A conventional etch process can then be used to remove portions of the $SiO_2$ layer 44 that are not covered by the developed photoresist, and a photoresist strip process can be used to remove the remaining portion of photoresist, leading to the structure shown in FIG. 2D. A portion of the patterned $SiO_2$ layer 62 exists over silicon substrate 42 where the pattern of remaining $SiO_2$ layer 62 matches that of blocking region 56 on mask 52. Of course, there can be other variations, modifications, and alternatives.

Figure 2D:
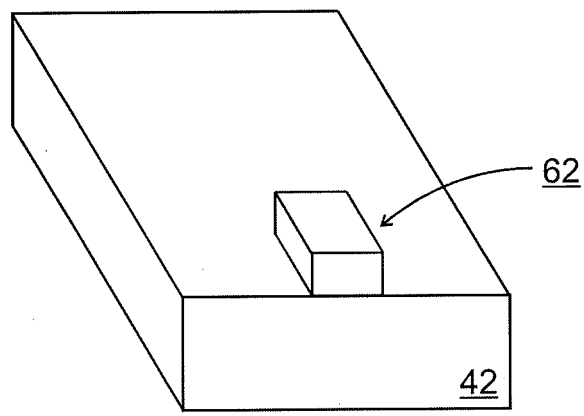
Figure 2E:
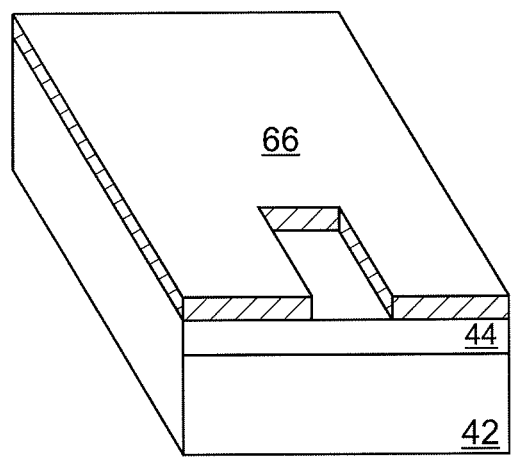
Figure 2F:
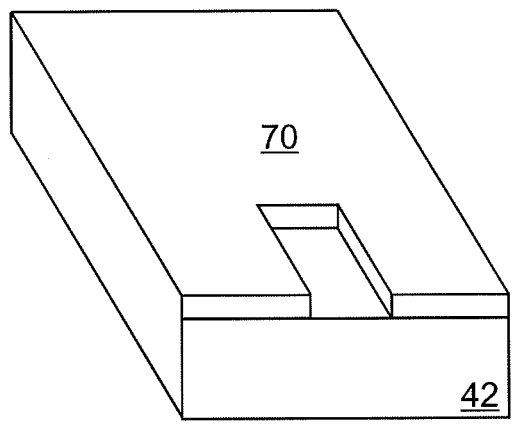

FIG. 2E follows from FIG. 2B and shows the result after exposure and development of the photoresist layer when a negative photoresist is used in place of the positive photoresist layer used in FIGS. 2C-2D. Light from an exposing source is passed through mask 52 as described above and reacts with the portions of exposed resist, causing them to become polymerized and insoluble to the developing solution. After the wafer is treated with the developing solution, the unpolymerized portions of resist 62 are removed, resulting in the structure shown in FIG. 2E. The portion of photoresist that was situated below blocking region 56 is removed. An etching process can now be conducted with the remaining portion 66 of the photoresist layer serving as an etch blocking layer. A portion of $SiO_2$ layer 44 is removed by the etching process. A photoresist strip process is then employed to remove photoresist layer 66 from the substrate, resulting in the structure shown in FIG. 2F, with patterned $SiO_2$ layer 70 disposed above substrate 42. Of course, there can be other variations, modifications, and alternatives.

One significant problem with photolithography processes is that the masks used in the processes represent a substantial cost to the company manufacturing the wafers. The masks must be constructed from a material with a very high level of purity such as high-grade quartz to ensure the exact light transmission properties needed, and then blocking regions must be formed on the masks. The formation of the blocking regions is normally not reversible, leading to specific masks being used for specific lithography processes. Due to the high cost of operating lithography exposure and development processes, it would be greatly advantageous to reduce the number of masks being employed within the lithography process, as well as the number of iterations required to form the desired circuit on the substrate. Of course, there can be other variations, modifications, and alternatives.

An exemplary mask or reticle is shown in FIGS. 3A and 3B which would require only require the selected mask to be used in the dual damascene process. FIGS. 3A and 3B, respectively, are exemplary top and cross-section views of the mask. These diagrams are merely examples, which should not unduly limit the scope of the claims herein. One of ordinary skill in the art would recognize many variations, modifications, and alternatives. In the top view of mask 80 shown in FIG. 3A, two distinct regions are present: via pattern region 84 and trench pattern region 82. Via pattern region 84 is located within the center of line pattern region 82 and possesses different light transmission characteristics than trench pattern region 82. Because the via in dual-damascene processes extends deeper than the trench within the layers formed on the substrate, via pattern region possesses a greater light transmission rate than trench pattern region 82. This allows for a different thickness of photoresist to be exposed between the two regions, leading to the photoresist layer having a stepped profile dependent upon the transmission rates of the different regions. Different light transmission characteristics may be obtained by using different materials for the blocking regions, by tailoring the chemical or physical properties of the material used for the blocking region. For example, one material could be used for trench pattern region 82, while a second material was used for via pattern region 84, or one material used for trench pattern region 82 and treated in a specific location to yield a portion of the material with different light transmission characteristics as the via pattern region 84, or different processes could be used to treat the substrate for different regions to yield regions with different light transmission characteristics. In a specific embodiment of the invention, fabrication of the blocking region on the mask may be performed by depositing a chrome film upon the mask. However, the process by which different transmission characteristics are achieved for the different reasons is not a critical factor, so long as different regions of the mask possess different transmission characteristics. Line 86 indicates the boundaries of the mask and which regions of the mask allow light through from the exposing source during the exposure process. Of course, there can be other variations, modifications, and alternatives.

FIG. 3B is a cross-section view of the mask shown in FIG. 3A. This diagram is merely an example, which should not unduly limit the scope of the claims herein. One of ordinary skill in the art would recognize many variations, modifications, and alternatives. Via pattern region 84 is in the center of the cross-region, between trench pattern regions 82. Regions 88 in both FIGS. 3A and 3B do not transmit light through the mask. While FIG. 3B shows via pattern region 84 and trench pattern region 82 as located within mask 80 in the cross-section view shown in FIG. 3B, via pattern region 84 and trench pattern region 82 could also be located on top or below mask 80 and attached by an adhering element or treated to possess a lasting connection with mask 80. While only two regions with different transmission characteristics are shown in FIGS. 3A and 3B, multiple regions with different transmission characteristics could be implemented for different applications. Of course, there can be other variations, modifications, and alternatives.

Figure 4D:
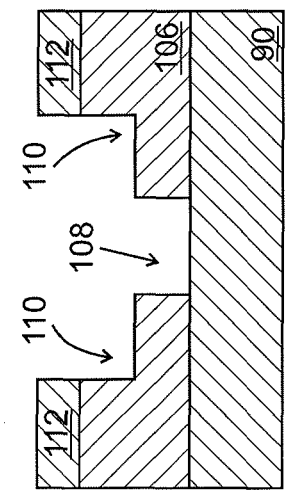
Figure 4C:
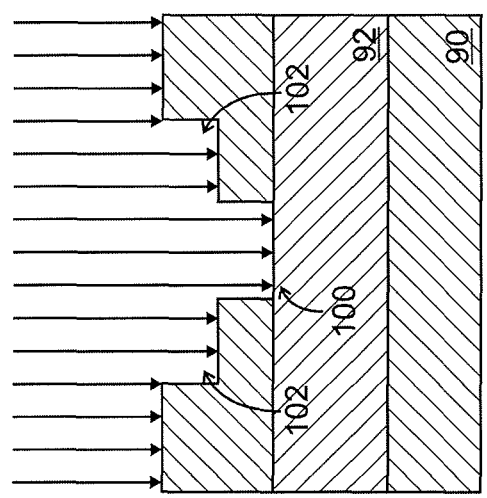
Figure 4E:
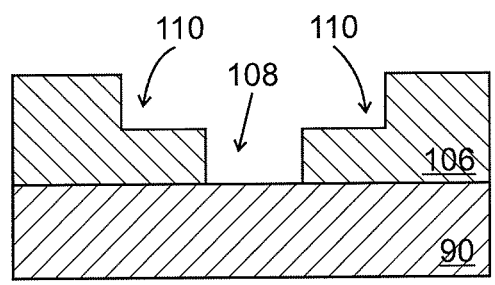
Figure 5:
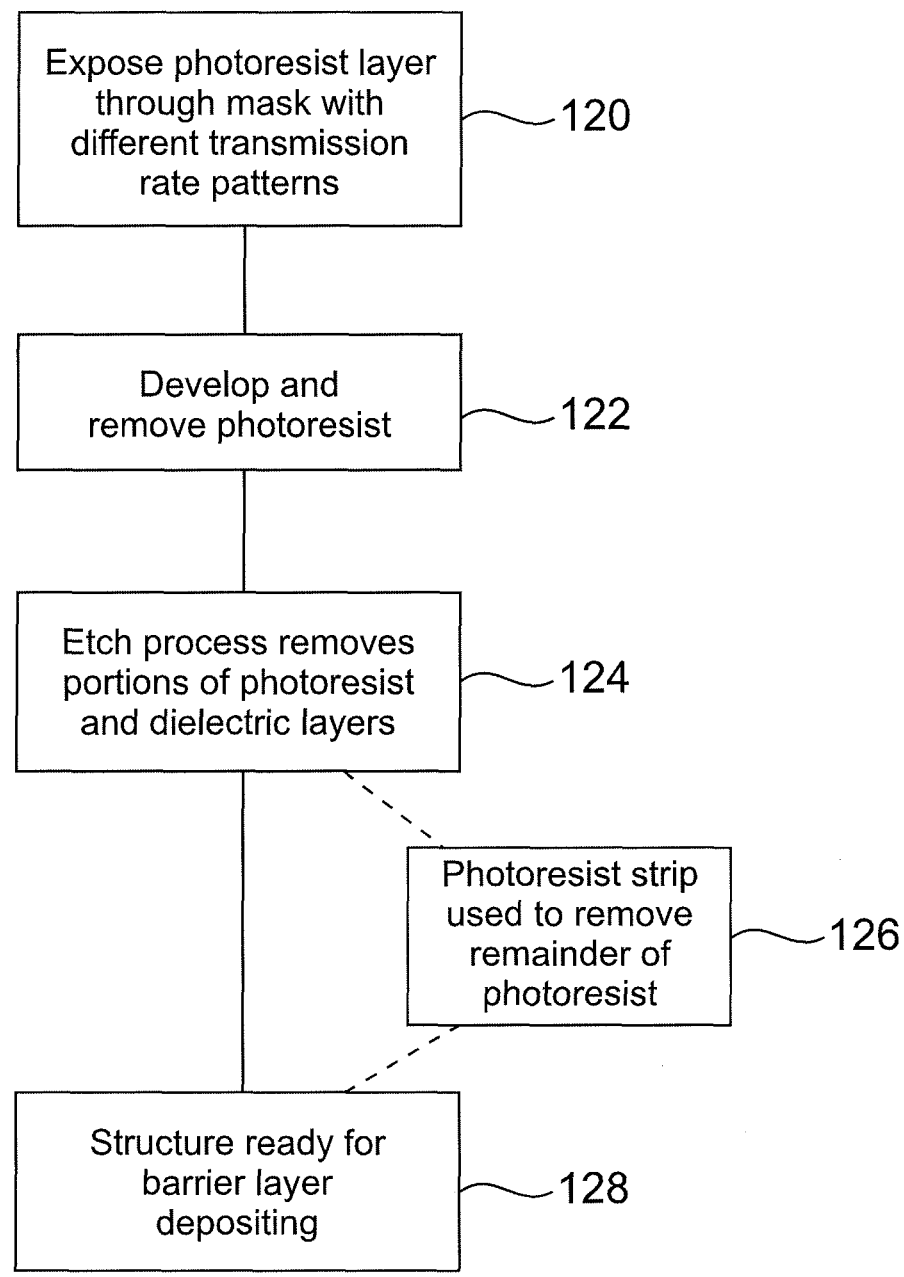
FIG. 5 is a simplified process flow chart showing the process flow during the dual damascene process using a selected mask.

FIGS. 4A-4E are exemplary cross-section views of layers overlying a surface region during a dual damascene process using a selected mask, while FIG. 5 is an accompanying process flow chart showing the process flow during the dual damascene process using a selected mask. These diagrams are merely examples, which should not unduly limit the scope of the claims herein. One of ordinary skill in the art would recognize many variations, modifications, and alternatives.

FIG. 4A shows a cross-section of the substrate whereby photoresist layer 94 overlies dielectric layer 92 and copper layer 90 on top of a surface region (not shown). The surface region may comprise any number of layers overlying the semiconductor substrate and is not limited to consist of only one layer. Barrier layers may be incorporated between the dielectric and copper layers to prevent diffusion and electromigration but have been omitted within the structures shown in FIGS. 4A-4E for simplicity. Photoresist layer 94 is exposed from an exposing source using mask 80. Mask 80, as described in FIGS. 3A and 3B, has different regions which possess different light transmission characteristics. Opaque regions 88 do not allow light to be transmitted through, while trench pattern regions 82 possess a lower transmission rate than via pattern region 84. Light from exposing source 96 penetrates to a deeper thickness of photoresist 94 through via pattern region 84 than trench pattern region 82 in step 120. A number of different factors control the actual thickness of the photoresist that is affected during the exposure process. These factors include the physical/chemical properties of the photoresist, the type of light, visible, UV, or other, selected as an exposing source, and the transmission properties of the regions of the mask that the exposing light 96 is transmitted through. However, these factors can be properly controlled by selecting the process conditions and materials used to yield an etch process that etches to a known thickness for a given photoresist, exposing source, and mask. Of course, there can be other variations, modifications, and alternatives.

After photoresist layer 94 has been exposed by light from exposing source 96 through mask 80, the exposed regions either become more soluble to a developing solution for positive resists or become polymerized and more difficult to dissolve for negative resists. Both types of resists can be used for the process flow described in FIGS. 4A-4E, but the process flow will be discussed in regards to positive resists. Either type of resist can be used with minimal or no detriment to the process. The thickness of the exposed regions of photoresist layer 94 that have become more soluble due to the exposing process differs due to the differing transmission properties of mask 80. The portion of photoresist layer 94 corresponding to via pattern region 84 that has been exposed extends to the entire thickness of the photoresist layer, while the portion of photoresist layer 94 corresponding to trench pattern regions 82 that has been exposed extends only to a partial thickness of the entire photoresist layer. After photoresist layer 94 is treated with a developing solution in step 122, the exposed regions of photoresist layer 94 are removed, yielding the structure shown in FIG. 4B. Via pattern 100 and trench pattern 102 have been formed in the photoresist layer 94, where via pattern 100 extends through the entire thickness of photoresist layer 94 to expose a contact opening to dielectric layer 92, and trench pattern 102 extends partially through photoresist layer 94. By utilizing the lithography process to remove different thicknesses of photoresist layer 94, only one etch and lithography process is needed to form the desired dual damascene structure. Of course, there can be other variations, modifications, and alternatives.

An etch process is used in step 124 to remove portions of both photoresist layer 94 and dielectric layer 92 during the same process. The ratio of the etch rates of dielectric layer 92 to photoresist layer 94 is chosen in accordance with the thickness of the respective layers so that a dual damascene pattern can be etched within the dielectric layer and allow contact to the metal layer below. For example, if the ratio of thicknesses of the photoresist and dielectric layers is 1:1 and the expose/development steps caused via pattern 100 to extend through the entire thickness of photoresist layer 94 and trench pattern 102 to extend through one-half of the entire thickness of photoresist layer 94, an ratio of etch rates of dielectric layer 92 to photoresist layer 94 of 1:1 would be suitable. This would allow the etch process to remove all of dielectric layer 92 below via pattern 100 and remove the remaining portion of photoresist layer 94 and a portion of dielectric layer 92 below trench pattern 102. However, different ratios of etch rates could also be employed other than 1:1 with sufficient testing. Of course, there can be other variations, modifications, and alternatives.

The result of the etching process is shown in FIG. 4E, where via 108 and trench 110 is etched into the dielectric layer in step 128. Trench 110 and via 108 can easily be filled by subsequent processes to form a vertical copper via connection and copper metal line. However, the etching process shown within FIG. 4C may not have completely removed the photoresist layer, and an additional photoresist strip step may be needed in step 126. This is shown in FIG. 4D, where photoresist regions 112 remain at the periphery of the structure, and are removed by a photoresist strip process. The result of the optional photoresist strip process is shown in FIG. 4E. The device is now ready for barrier layer deposition and copper deposition into the via and trench areas to form metal interconnections as a dual damascene structure can now be formed. In a specific embodiment, a diffusion barrier is formed over the dielectric layer and the copper layer, a copper seed layer is formed overlying the diffusion barrier layer, and a copper layer is formed from the copper seed layer using a electrochemical plating (ECP) process. The copper layer is then planarized by using a chemical-mechanical polishing (CMP) process. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing integrated circuit devices comprising:
    providing a semiconductor substrate with a surface region, the surface region comprising one or more layers overlying the semiconductor substrate;
    forming a copper layer overlying the surface region;
    forming a dielectric layer overlying the copper layer;
    forming a photoresist layer overlying the dielectric layer;
    exposing a portion of the photoresist layer by placing a reticle over the photoresist layer and transmitting light from an exposing source to the photoresist layer, the reticle possessing at least two regions with different transmission rates, a first region of the reticle being used to create a via etch pattern in the photoresist layer and a second region of the reticle being used to create a trench etch pattern in the photoresist layer;
    developing the photoresist layer, whereby a first portion of the photoresist layer is removed to expose a portion of the dielectric layer and a thickness of the second portion of the photoresist layer is formed; and
    etching the photoresist layer and the dielectric layer in a single step to create a dual damascene pattern in the dielectric layer, wherein the ratio of a thickness of the first portion of the photoresist layer and a thickness of the dielectric layer is 1:1 and the ratio of the etch rate of the photoresist layer to the dielectric layer is 1:1.

2. The method of claim 1 whereby the first region of the reticle possesses a first transmission rate, and the second region of the reticle possesses a second transmission rate, and the first transmission rate is greater than the second.

3. The method of claim 1 wherein the exposing step includes the steps of:
   providing a light-transmissive reticle substrate;
   changing the chemical or physical properties of the light-transmissive reticle substrate to create the first and second regions of the reticle.

4. The method of claim 1 wherein the exposing step includes the steps of:
   providing a light-transmissive reticle substrate;
   etching the light-transmissive reticle substrate to create the first and second regions of the reticle.

5. The method of claim 1 wherein the exposing step is performed by exposing the photoresist layer to an ultraviolet light.

6. The method of claim 1 wherein the exposing step is performed by exposing the photoresist layer to a visible light.

7. The method of claim 1 wherein the etching process removes a remainder of the photoresist layer left after the developing process.

\* \* \* \* \*